(12) United States Patent
Tain et al.

(10) Patent No.: US 7,517,114 B2
(45) Date of Patent: Apr. 14, 2009

(54) LIGHTING DEVICES

(75) Inventors: Ra-Min Tain, Taipei County (TW); Shyi-Ching Liau, Hsinchu County (TW); Chun-Kai Liu, Taipei (TW); Ming-Ji Dai, Chiayi County (TW); Chih-Kuang Yu, Chiayi (TW); Wei-Kuo Han, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 15 days.

(21) Appl. No.: 11/769,630

(22) Filed: Jun. 27, 2007

(65) Prior Publication Data

US 2008/0013320 A1    Jan. 17, 2008

(30) Foreign Application Priority Data

Jul. 13, 2006   (TW)   .............................. 95212303 U

(51) Int. Cl.
*F21V 29/00*   (2006.01)

(52) U.S. Cl. .................. 362/294; 362/373; 362/800; 257/99; 257/930; 361/688

(58) Field of Classification Search ................ 362/294, 362/373, 800; 257/99, 707, 712, 717, 930; 361/688
See application file for complete search history.

(56) References Cited

U.S. PATENT DOCUMENTS

| 6,902,291 | B2 | 6/2005 | Rizkin et al. |
| 7,357,525 | B2 * | 4/2008 | Doyle .......................... 362/800 |
| 2007/0012938 | A1 * | 1/2007 | Yu et al. ........................ 257/99 |

* cited by examiner

*Primary Examiner*—Stephen F Husar
(74) *Attorney, Agent, or Firm*—Quintero Law Office

(57) ABSTRACT

Lighting devices are provided. A lighting device includes a first substrate, a second substrate, a light source and a thermoelectric cooling chip set disposed between the first and second substrates. The first substrate includes a core, a first circuit layer, and a second circuit layer, wherein the first and second circuit layers are disposed on opposite sides of the core. The second substrate comprises a third circuit layer. The light source is disposed on the first substrate and electrically connected to the first circuit layer. The thermoelectric cooling chip set is electrically connected to the second and third circuit layers, to dissipate heat from the light source.

25 Claims, 3 Drawing Sheets

LIGHTING DEVICES

BACKGROUND OF THE INVENTION

1. Field of the Invention

The invention relates in general to lighting devices and in particular to lighting devices improving cooling efficiency.

2. Description of the Related Art

Referring to FIG. 1, U.S. Pat. No. 6,902,291 discloses a conventional lighting device 10 primarily including a light source 12, a light transformer 14, a circuit board 16, a holder 18, a cooling device 20, and a heat sink 26. The light source 12 is connected to the circuit board 16 at the bottom of the holder 18. The light transformer 14 is mounted on the holder 18 for guiding light from the light source 12. The cooling device 20 is connected to the holder 18 and the heat sink 26 via substrates 22 and 24, respectively, such that heat can be transferred from the light source 12 to the heat sink 26, preventing overheat of the light source 12.

Generally, the substrates 22 and 24 are attached to the holder 18 and the heat sink 26 by adhesive or soldering. As conventional adhesive and soldering materials may increase production cost, assembly complexity, and thermal resistance, they are not suitable for compact lighting devices.

BRIEF SUMMARY OF THE INVENTION

Lighting devices are provided. A lighting device includes a first substrate, a second substrate, a light source and a thermoelectric cooling chip set disposed between the first and second substrates. The first substrate includes a core, a first circuit layer, and a second circuit layer, wherein the first and second circuit layers are disposed on opposite sides of the core. The second substrate comprises a third circuit layer. The light source is disposed on the first substrate and electrically connected to the first circuit layer. The thermoelectric cooling chip set is electrically connected to the second and third circuit layers, to dissipate heat from the light source.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
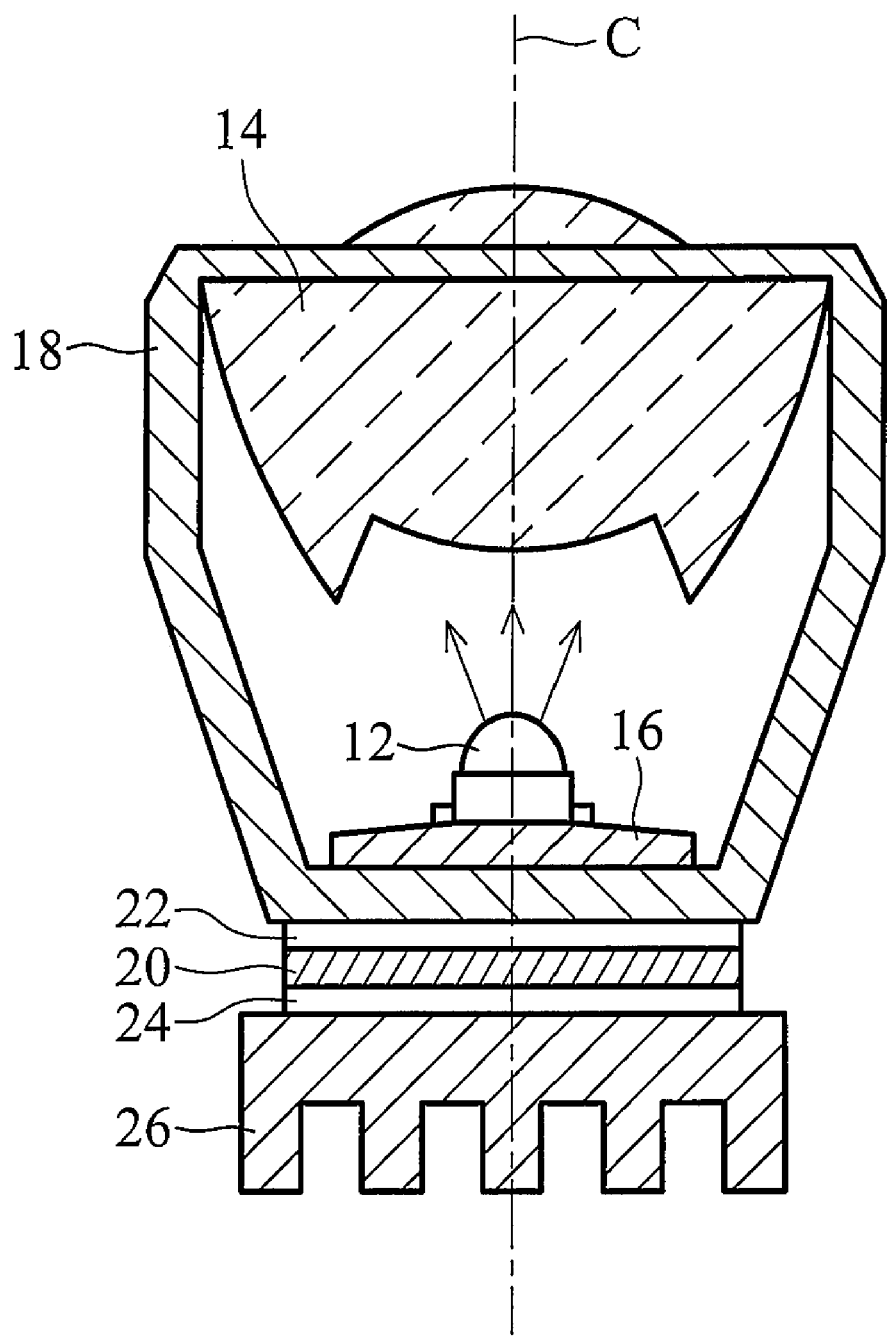
FIG. 1 is a sectional view of a conventional lighting device.
Figure 2:
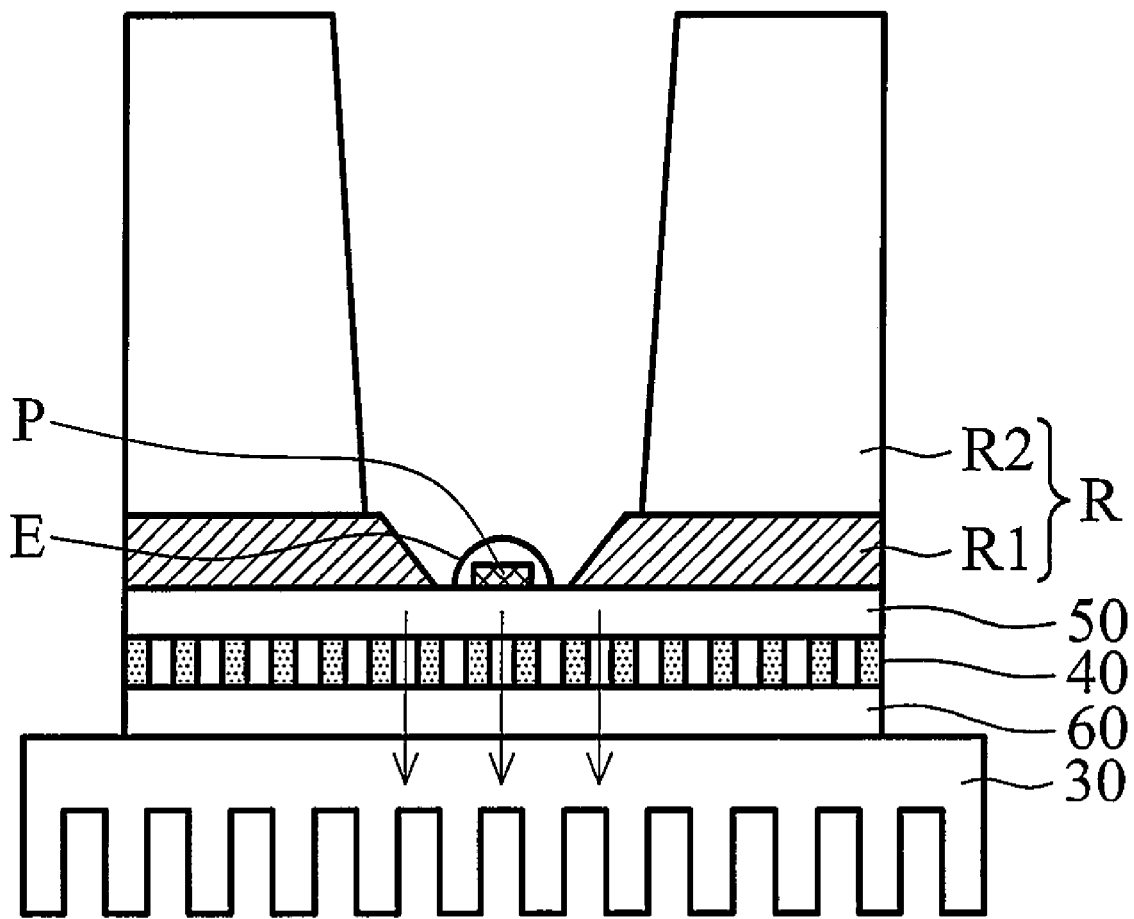
FIG. 2 is a sectional view of an embodiment of a lighting device.

Referring to FIG. 2, an embodiment of a lighting device primarily comprises a light source P, a package structure E, a reflector R, a heat sink 30, a thermoelectric cooling chip set 40, a first substrate 50, and a second substrate 60. As shown in FIG. 2, the light source P, such as an LED, is disposed on the first substrate 50. The package structure E may comprise epoxy molding compound or liquid encapsulation material encompassing the light source P. The reflector R is connected to the first substrate 50 and around the light source P. Light from the light source P is reflected and guided upwardly by reflective portions R1 and R2 of the reflector R.

In this embodiment, the thermoelectric cooling chip set 40 is disposed between the first and second substrates 50 and 60, comprising a plurality of N-type and P-type semiconductor elements. Here, the light source P and the thermoelectric cooling chip set 40 are directly bonded on opposite sides of the first substrate 50 without adhesive, reducing production cost and thermal resistance. The second substrate 60 is directly connected to the heat sink 30, facilitating heat dissipation from the light source P and preventing overheat thereof.

Figure 3:
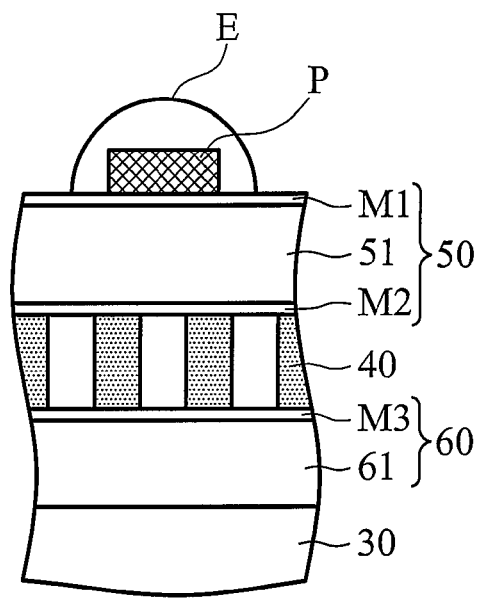
FIG. 3 is a partial sectional view of the lighting device in FIG. 2.

Referring to FIG. 3, an embodiment of the first substrate 50 includes a first insulating core 51, a first circuit layer M1, and a second circuit layer M2. The circuit layers M1 and M2 are formed on the top and bottom surfaces of the first insulating core 51, electrically connecting the light source P and a cold side of the thermoelectric cooling chip set 40, respectively. Here, the first substrate 50 is used as a common circuit board directly connecting the light source P and a cold side of the thermoelectric cooling chip set 40 without adhesive, enhancing thermal transfer and cooling efficiency thereof. Moreover, in FIG. 3, the second substrate 60 includes a second insulating core 61 and a third circuit layer M3 formed thereon. The third circuit layer M3 is electrically connected to the hot side of the thermoelectric cooling chip set 40, and the second insulating core 61 is connected to the heat sink 30 for heat dissipation.

Figure 4:
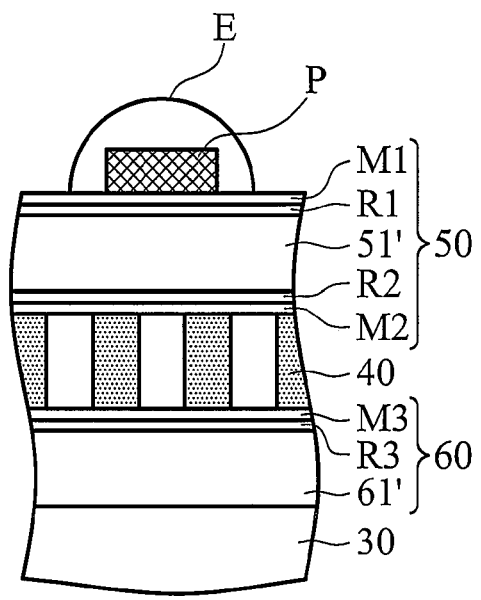
FIG. 4 is a partial sectional view of another embodiment of a lighting device.

Referring to FIG. 4, another embodiment of the first substrate 50 is a metal-core substrate, including a metal core 51' with high thermal conductivity. In FIG. 4, a first insulating layer R1 is formed on the top surface of the metal core 51', and a first circuit layer M1 is formed on the first insulating layer R1. Furthermore, a second insulating layer R2 is formed on the bottom surface of the metal core 51', and a second circuit layer M2 is formed below the second insulating layer R2. Here, the first and second circuit layers M1 and M2 are electrically connected to the light source P and the cold side of the thermoelectric cooling chip set 40, respectively. With first substrate 50 acting as a common circuit board with respect to the light source P and the thermoelectric cooling chip set 40 not requiring adhesive or soldering, thermal transfer and cooling efficiency thereof are enhanced.

As shown in FIG. 4, the second substrate 60 includes a second metal core 61' with a third insulating layer R3 and a third circuit layer M3 formed thereon. The third circuit layer M3 is electrically connected to the hot side of the thermoelectric cooling chip set 40, and the second metal core 61' is connected to the heat sink 30 for heat dissipation. In some embodiments, the insulating layers R1, R2, and R3 may comprise aluminum oxide, slilcon, silicon nitride or aluminum nitride for insulating the circuit layers M1, M2, and M3 from the metal cores 51' and 61'. Furthermore, the heat sink 30 can be metal and integrally formed with the second metal core 61', reducing production cost and improving cooling efficiency.

Lighting devices are provided according to the embodiments. A lighting device comprises a light source and a thermoelectric cooling chip set disposed between two substrates. One of the substrates may comprise a metal or insulating core, acting as a common circuit board with respect to the light source and the thermoelectric cooling chip set. Compared with conventional adhesive or soldering means, the present invention has low production cost and improved cooling efficiency.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lighting device, comprising:
   a first substrate, comprising a first insulating core, a first circuit layer, and a second circuit layer, wherein the first and second circuit layers are formed on opposite sides of the first insulating core;
   a second substrate, comprising a third circuit layer;
   a light source, disposed on the first substrate and electrically connected to the first circuit layer; and
   a thermoelectric cooling chip set, disposed between the first and second substrates, electrically connecting the second and third circuit layers for dissipating heat from the light source, wherein the second circuit layer is between and separates the first insulating core and the thermoelectric cooling chip set.

2. The lighting device of claim 1, wherein the light source comprises at least an LED.

3. The lighting device of claim 1, further comprising a heat sink connected to the second substrate.

4. The lighting device of claim 1, wherein the second substrate further comprises a second insulating core with the third circuit layer disposed thereon.

5. The lighting device of claim 1, wherein the second substrate further comprises a metal core and an insulating layer formed on the metal core, wherein the third circuit layer is formed on the insulating layer.

6. The lighting device of claim 5, further comprising a heat sink integrally formed with the metal core.

7. The lighting device of claim 1, wherein the second and third circuit layers respectively connect to a cold side and a hot side of the thermoelectric cooling chip set.

8. The lighting device of claim 1, further comprising a reflector disposed on the first substrate to reflect light from the light source.

9. The lighting device of claim 1, further comprising a package structure encompassing the light source.

10. The lighting device of claim 9, wherein the package structure comprises liquid encapsulation material.

11. The lighting device of claim 5, wherein the metal core has high thermal conductivity.

12. A lighting device, comprising:
    a first substrate, comprising a first metal core, a first circuit layer, a second circuit layer, a first insulating layer, and a second insulating layer, wherein the first circuit layer and the first insulating layer are disposed on a first side of the first metal core, and the second circuit layer and the second insulating layer are disposed on a second side of the first metal core, opposite to the first side;
    a second substrate, comprising a third circuit layer;
    a light source, disposed on the first substrate and electrically connected to the first circuit layer; and
    a thermoelectric cooling chip set, disposed between the first and second substrates, electrically connecting the second and third circuit layers for dissipating heat from the light source.

13. The lighting device of claim 12, wherein the light source comprises at least an LED.

14. The lighting device of claim 12, further comprising a heat sink connected to the second substrate.

15. The lighting device of claim 12, wherein the second substrate further comprises a second metal core and a third insulating layer formed on the second metal core, and the third circuit layer is formed on the third insulating layer.

16. The lighting device of claim 15, further comprising a heat sink integrally formed with the second metal core.

17. The lighting device of claim 12, wherein the first insulating layer comprises aluminum oxide, silicon, silicon nitride or aluminum nitride for insulating the first circuit layer from the first metal core.

18. The lighting device of claim 12, wherein the second insulating layer comprises aluminum oxide, silicon, silicon nitride or aluminum nitride for insulating the second circuit layer from the first metal core.

19. The lighting device of claim 12, wherein the second substrate further comprises an insulating core with the third circuit layer formed thereon.

20. The lighting device of claim 12, further comprising package structure encompassing the light source.

21. The lighting device of claim 20, wherein the package structure comprises liquid encapsulation material.

22. The lighting device of claim 12, wherein the second and third circuit layers respectively connect to a cold side and a hot side of the thermoelectric cooling chip set.

23. The lighting device of claim 12, further comprising a reflector disposed on the first substrate to reflect light from the light source.

24. The lighting device of claim 12, wherein the first metal core has high thermal conductivity.

25. The lighting device of claim 15, wherein the second metal core has high thermal conductivity.

* * * * *